United States Patent [19]
Burr et al.

[11] Patent Number: 5,780,912
[45] Date of Patent: Jul. 14, 1998

[54] ASYMMETRIC LOW POWER MOS DEVICES

[75] Inventors: James B. Burr, Foster City; Michael P. Brassington, Sunnyvale, both of Calif.

[73] Assignee: Sun Microsystems, Inc., Mountain View, Calif.

[21] Appl. No.: 675,804

[22] Filed: Jul. 5, 1996

Related U.S. Application Data

[63] Continuation of Ser. No. 357,436, Dec. 16, 1994, abandoned, which is a continuation-in-part of Ser. No. 292,513, Aug. 18, 1994.

[51] Int. Cl.$^6$ .......................... H01L 29/76; H01L 29/788; H01L 29/94
[52] U.S. Cl. ..................... 257/408; 257/316; 257/344
[58] Field of Search ........................ 257/315, 316, 257/335, 336, 337, 344

[56] References Cited

U.S. PATENT DOCUMENTS

| | | | |
|---|---|---|---|
| 4,342,149 | 8/1982 | Jacobs et al. | 29/576 |
| 4,442,589 | 4/1984 | Doo et al. | 29/571 |
| 4,578,128 | 3/1986 | Mundt | 148/191 |
| 4,771,012 | 9/1988 | Yabu et al. | 437/29 |
| 4,939,571 | 7/1990 | Nishizawa et al. | 257/408 |
| 4,949,140 | 8/1990 | Tam | 257/316 |
| 5,210,044 | 5/1993 | Yoshikawa | 437/43 |
| 5,264,384 | 11/1993 | Kaya et al. | 437/43 |
| 5,364,807 | 11/1994 | Hwang | 437/44 |
| 5,366,915 | 11/1994 | Kodama | 437/43 |
| 5,371,394 | 12/1994 | Ma et al. | 257/335 |
| 5,376,566 | 12/1994 | Gonzalez | 437/35 |
| 5,378,909 | 1/1995 | Chang et al. | 257/316 |
| 5,424,567 | 6/1995 | Chen | 257/315 |
| 5,427,964 | 6/1995 | Kaneshiro et al. | 437/41 |

FOREIGN PATENT DOCUMENTS

| | | |
|---|---|---|
| 0 193 117 | 9/1986 | European Pat. Off. . |
| 0 507 567 A3 | 10/1992 | European Pat. Off. . |
| 58-194367 | 12/1983 | Japan . |
| 59-124164 | 7/1984 | Japan . |
| 62-71277 | 4/1987 | Japan . |
| 63-66967 | 3/1988 | Japan . |
| 01-37055 | 2/1989 | Japan .................... 257/408 |
| 6-275636 | 9/1994 | Japan . |

OTHER PUBLICATIONS

Buti et al; "A new Asymmetrical Halo Source GOLD Drain (HS–GOLD) . . . "; IEEE transactions on electron devices vol. 38, No. 8, Aug. 1991.

Ohkura, Iaso, Tomisawa, Osamu, Ohmori, Masashi, and Nakano, Takao Electrical Characteristics of a DSA MOS Transistor with a Fine Structure. IEEE Transactions on Electron Devices, pp. 430–435, vol. ED–26, No. 4, Apr. 1979.

Patent Abstract of Japan, vol. 10, No. 091, (E–394), 9 Apr. 1986, and JP–A–60 233857 (Nippon Denki KK) 20 Nov. 1985.

Nagai, Ryo, Umeda, Kazunori, Takeda, Eiji. "Low–Voltage High–Gain 0.2 μm N–Channel Metal Oxide Semiconductor Field Effect Transistors by Channel Counter Doping with Arsenic", pp. 434–437, Japanese Journal of Applied Physics, vol. 32, No. 1B, Tokyo, Japan, Jan. 1993.

(List continued on next page.)

*Primary Examiner*—Wael Fahmy
*Attorney, Agent, or Firm*—Hickman Beyer & Weaver,LLP

[57] ABSTRACT

Low threshold voltage MOS devices having asymmetric halo implants are disclosed herein. An asymmetric halo implant provides a pocket region located under a device's source or drain near where the source (or drain) edge abuts the device's channel region. The pocket region has the same conductivity type as the device's bulk (albeit at a higher dopant concentration) and, of course, the opposite conductivity type as the device's source and drain. Only the source or drain, not both, have the primary pocket region. An symmetric halo device behaves like two pseudo-MOS devices in series: a "source FET" and a "drain FET." If the pocket implant is located under the source, the source FET will have a higher threshold voltage and a much shorter effective channel length than the drain FET.

28 Claims, 9 Drawing Sheets

OTHER PUBLICATIONS

Yan, R. H.; Lee, K.F.; Jeon, D.Y.; Kim, Y.O.; Park, B. G.; Pinto, M. R.; Rafferty, C.S.; Tennant, D. M.; Westerwick, E. H.; Chin, G. M.; Morris, M.D.; Early, K.; Mulgrew, P.; Mansfield, W.M.; Watts, R. K.; Voshchenkov, A. M.; Bokor, J.; Swartz, R.G.; and Ourmazd, A.; "High Performance 0.1-μm Room Temperature Si MOSFETs", Symposium on VLSI Technology Digest of Technical Papers, pp. 86–87, 1992.

Aoki, M.; Ishii, T.; Yoshimura, T.; Iiiyima, S., Yamanaka, T.; Kure, T.; Ohyu, K.; Shimohigashi, K.; "0.1 μm CMOS Devices Using Low–Impurity Channel Transistors (LICT)", pp. 9.8.1–9.8.3, IEDM, 1987.

Yoshimura, Hisao; Matsuoka, Fumitomo; and Masakaru, Kakumu "New CMOS Shallow Junction Well FET Structure (CMOS–SJET) for Low Power–Supply Voltage", Semiconductor Device Engineering Laboratory, Japan, Proceedings of IEDM (1992), pp. 909–912.

Burr, James B. and Peterson, Allen M.; "Energy Considerations in Multichip–Module Multiprocessors", *IEEE International Conference on Computer Design*, pp. 593–600, 1991.

Burr, J. and Peterson, A.; "Ultra Low Power CMOS Technology", *NASA VLSI Design Symposium*, pp. 4.2.1–4.2.13, 1991.

Burr, Jim; "Stanford Ultra Low Power CMOS", Symposium Record, Hot Chips. V, pp. 7.4.1–7.4.12, Stanford, CA, 1993.

"A New Lease on Life for Old–Fashioned Chips", Business Week, Science and Technology, p. 100, Dec. 20, 1993.

Burr, James B., and Scott, John, "A 200mV Self–Testing Encoder/Decoder using Stanford Ultra–Low Power CMOS", IEEE International Solid–State Circuits Conference, 1994.

Notes from Dr. Burr's dinner meeting with Hitachi employee.

Okumura, Yoshinori; Shirahata, Masayoshi; Hachisuka, Atsushi; Okudaira, Tomonori; Arima, Hideaki; and Matsukawa, Takayuki; "Source–to–Drain Nonuniformly Doped Channel (NUDC) MOSFET Structures for High Current Drivability and Threshold Voltage Controllability", pp. 2541–2552, IEEE Transaction on Electron Devices, vol. 39, No. 11, Nov. 1992.

Sai-Halasz, George A.; Wordeman, Matthew R.; Kern, D.P.; Rishton, S.; and Ganin, E. "High Transconductance and Velocity Overshoot in NMOS Devices at the 0.1 μm Gate–Length Level", pp. 464–466, IEEE Electron Device Letters, vol. 9, No. 9, Sep. 1988.

Jayaraman, R.; Rumennik, V.; Singer, B. and Stupp, E.H., "Comparison of High Voltage Devices for Power Integrated Circuits," pp. 258–261, CH2099–0/84/0000–0258, IEDM 1984.

Patent Abstract of Japan, vol. 008, No. 025 (E–225), 2 Feb. 1984, and JP–A–58 188160 (Sanyo Denki KK) 2 Nov. 1983.

Patent Abstract of Japan, vol. 009, No. 181 (E–331), 26 Jul. 1985, and JP–A–60 053083 (Hitachi Seisakusho KK) 26 Mar. 1985.

Konaka, Masami, Iwai, Hiroshi, and Nishi, Yoshio, "Suppression of Anomalous Drain Current in Short Channel Mosfet", Japanese Journal of Applied Physics, Supplement 18–1, vol. 18, pp. 27–33, Tokyo Japan, 1979.

Patent Abstract of Japan, vol. 008, No. 036, (E–227), 16 Feb. 1984, and JP–A–58 194367 (Nippon Denki KK) 12 Nov. 1983.

Patent Abstract of Japan, vol. 013, No. 230 (E–764), 26 May 1989, and JP–A–01 037055 (Fujitsi Ltd) 7 Feb. 1989.

ASYMMETRIC LOW POWER MOS DEVICES

CROSS-REFERENCE TO RELATED APPLICATIONS

This is a continuation of application Ser. No. 08/357,436 filed Dec. 16, 1994 now abandoned which is a continuation-in-part of U.S. patent application Ser. No. 08/292,513, filed Aug. 18, 1994, entitled LOW POWER, HIGH PERFORMANCE JUNCTION TRANSISTOR, and naming Burr and Brassington as inventors. This application is incorporated herein by reference in its entirety for all purposes.

BACKGROUND OF THE INVENTION

The present invention generally relates to high performance transistor devices, and more specifically to low threshold voltage, asymmetric MOS transistors having pocket regions of increased dopant concentration located below the transistors' sources or drains.

In circuits comprised of conventional MOS devices, the relationship of maximum frequency $f_{max}$ to supply voltage and threshold voltage is governed by long and short channel effects of the component devices. As expected, for longer channel devices, the long channel effects predominate and for shorter channel devices, the short channel effects predominate. Most devices exhibit some characteristics of both, with devices having channel lengths between one and two micrometers exhibiting both characteristics about equally. The maximum frequency of circuits comprised of truly long channel devices is given by:

$$f_{max} \propto (V_{dd}-V_t)^2/V_{dd}$$

The same parameter for circuits comprised of truly short channel devices is given by:

$$f_{max} \propto (V_{dd}-V_t)/V_{dd} = 1-V_t/V_{dd}$$

From these equations, it is apparent that the performance (frequency) of a circuit comprised of truly long channel devices is dependent upon the absolute value of the supply voltage, "Vdd." Thus, if the supply voltage to the devices in such circuits is lowered, performance is also lowered. However, in circuits comprised of truly short channel devices, performance is governed by the ratio of threshold voltage to supply voltage (Vt/Vdd). This means that in such circuits the supply voltage to the devices can be lowered with no loss in performance, $f_{max}$, so long as the ratio Vt/Vdd is kept constant. For many devices, this relation is nearly true, and it becomes exactly true for devices in which the saturation voltage scales with the supply voltage.

Although low Vt short channel devices appear attractive for the above reason, a problem has been observed with very short channel devices having low threshold voltages. Specifically, the distance between the source and drain regions may be so small that the depletion regions in the channel region adjacent the source and drain can overlap to form a conductive path for charge carriers in the channel region between the source and drain. This results in a phenomenon known as punch through in which current flows through the path created by depletion region, even when the transistor is turned "off" (i.e., the gate voltage does not exceed the threshold voltage).

In high threshold voltage devices, it is known that a "buried electrode" or "ground plane" may be employed to suppress growth of depletion regions in the channel region and thereby prevent punch through. Such devices are described in an article by R. H. Yan, et al., "High Performance 0.1 mm Room Temperature Si MOSFETs," 1992 Symposium on VLSI Technology Digest of Technical Papers, pages 86–87, which is incorporated herein by reference for all purposes. Briefly, a buried electrode is a region of relatively high dopant concentration extending underneath the channel region and having the same conductivity type as the well. A further advance is described in the US patent application Ser. No. 08/292,513 (previously incorporated herein by reference) which discloses the use of buried electrodes in low threshold voltage devices to prevent punch through.

While low threshold voltage devices having buried electrodes should generally provide improved performance and reduced power consumption, alternative approaches to eliminating the problem of punch through have been explored. One such approach involves devices fabricated with symmetrical halo implants. Halo implants provide pockets of increased dopant concentration (of the same conductivity type as the channel region) in areas underlying the source and drain edges adjacent the channel region. Unlike a buried electrode, the pocket regions of a halo device do not extend underneath the entire channel region. While the performance of some symmetric halo devices has been encouraging, it is believed that further improvements in device performance should be attainable.

SUMMARY OF THE INVENTION

The present invention provides low threshold voltage MOS devices having asymmetric halo implants. An asymmetric halo implant provides a pocket region located under a device's source (or drain) near the source (or drain) edge abutting the device's channel region. As used herein, the term "channel region" refers to the entire electrically active region between the source and drain, not just the inversion layer formed when the gate voltage exceeds Vt. The pocket region has the same conductivity type as the device's bulk region (albeit at a higher dopant concentration) and, of course, the opposite conductivity type as the device's source and drain. Typically, the pocket region is provided under only one of the source or drain (hence the device is "asymmetric"). It is believed that an asymmetric halo device behaves like two pseudo-MOS devices in series: a "source FET" and a "drain FET." The device is designed such that the one of these (the one on the side of the device having the pocket region) will have a higher threshold voltage and a much shorter effective channel length than the other. At relatively low gate voltages (just exceeding the threshold voltage of the shorter channel pseudo-device), the performance of the overall MOS device will be governed by the performance of the shorter channel pseudo-device having the higher threshold voltage. This is very desirable because the performance of this pseudo-device is expected to be exceptional due to its short channel length. Thus, operating asymmetric halo devices at relatively low gate voltages should result in very fast switching speeds.

One aspect of the present invention provides an asymmetric MOS device on a semiconductor substrate. The device includes the following elements: (1) a bulk region having an average dopant concentration of a first conductivity type; (2) source and drain regions of a second conductivity type positioned within said bulk region and separated by a channel region; (3) an asymmetric halo (or "pocket") region having a dopant concentration of the first conductivity type, and abutting one of the source or drain regions and proximate the channel region; and (4) a gate positioned over the channel region. It should be noted that while the halo region generally abuts only one of the source and drain regions (thus the device is termed "asymmetric"), some devices may have a "secondary" halo region abutting the other device element. Such secondary halo regions will not have the same level of dopant concentration and/or size as the "primary" halo region.

The device is also structured such that it has a ratio of "on current" to "off current" that is at most about $10^5$. The on current is the current that flows between the device's source and drain when the device is "on," i.e., when there is strong inversion in the channel region (Vds=Vdd=Vgs). The off current is the current flowing between the device's source and drain when the device is off (Vds=Vdd; Vgs=0). The off current is synonymous with "leakage current." Generally, devices with such low ratios of on current to off current have low threshold voltages (e.g., between about ±150 mV).

In 0.35 μm technology (i.e., the gate poly length is about 0.35 μm and the gate oxide is about 65 Å thick), the asymmetric halo region preferably has a dopant concentration of at least about $1 \times 10^{16}$ atoms/cm$^3$ (and more preferably between about $1 \times 10^{17}$ and $1 \times 10^{18}$ atoms/cm$^3$). In some preferred embodiments, the asymmetric halo region is located under the source or drain region and does not extend into or under the channel region. In other embodiments, however, the asymmetric halo region may partially extend into or under the channel region adjacent the source region. To maintain a low gate threshold voltage, the channel region dopant concentration should be held to at most about $1 \times 10^{16}$ atoms/cm$^3$ and preferably between about $1 \times 10^{14}$ and $1 \times 10^{16}$ atoms/cm$^3$. Further, at low Vts, it will generally be desirable to provide the device with a tunable gate threshold voltage by, for example, providing back biasing capability. This allows the absolute value of the threshold voltage to be adjusted to account for inevitable process and environmental (e.g., temperature) variations which can change Vt by on the order of about 100 millivolts. Still further, the dopant concentrations in the source and drain regions are preferably relatively high so that the series resistance in the device is low. If the device has tip regions in the source and/or drain, these may have dopant concentrations of, for example, about $4 \times 10^{19}$ to $8 \times 10^{19}$ atoms/cm$^3$.

In one preferred embodiment, the asymmetric MOS device includes a counterdopant of the second conductivity type located in at least a portion of the channel region. Preferably the counterdopant is provided in a concentration of between about $10^{16}$ and $10^{18}$ cm$^{-3}$ and is located such that a depletion region associated with a counterdopant-bulk junction does not extend across the channel region to the gate.

Another aspect of this invention provides a method of forming an asymmetric MOS transistor on a semiconductor substrate. This method includes the following steps: (1) forming a bulk region having a first conductivity type; (2) forming a gate over a portion of the bulk region which defines a channel region (the channel region should have a net dopant concentration of the first conductivity type of not greater than about $1 \times 10^{16}$ atoms/cm$^3$ to provide the device with a low threshold voltage); (3) performing an asymmetric halo implant which implants dopant atoms of said first conductivity type to form a pocket region on a first side of said channel region; and (4) forming source and drain regions of a second conductivity type separated by the channel region. The pocket region should be formed such that it abuts at least a portion of one of the source or drain regions and is proximate to the channel region. In some embodiments, the asymmetric halo implant need not be formed before the step of forming the source and drain, but may be formed after the source and drain are at least partially formed.

In preferred embodiments, the step of performing an asymmetric halo implant is conducted at an implant energy of between about 50 and 70 keV and at a dose of between about $5 \times 10^{12}$ to $5 \times 10^{13}$ cm$^{-2}$. Further, the step of forming source and drain regions is preferably performed in three substeps: (1) conducting an implant of the second conductivity type at an implant energy of between about 20 and 60 keV and at a dose of between about $10^{13}$–$10^{14}$ cm$^{-2}$ on either side of the gate (to form "tip" regions of the source and drain); (2) forming a spacer on both sides of the gate; and (3) conducting a second implant of the second conductivity type in the source and drain regions and on either side the spacer at an implant energy of between about 50–100 keV and at a dose of between about $1 \times 10^{15}$–$5 \times 10^{15}$ cm$^{-2}$.

These and other features and advantages of the present invention will become apparent to those skilled in the art upon reading the following description and studying the associated figures.

DETAILED DESCRIPTION OF THE INVENTION

Figure 1:
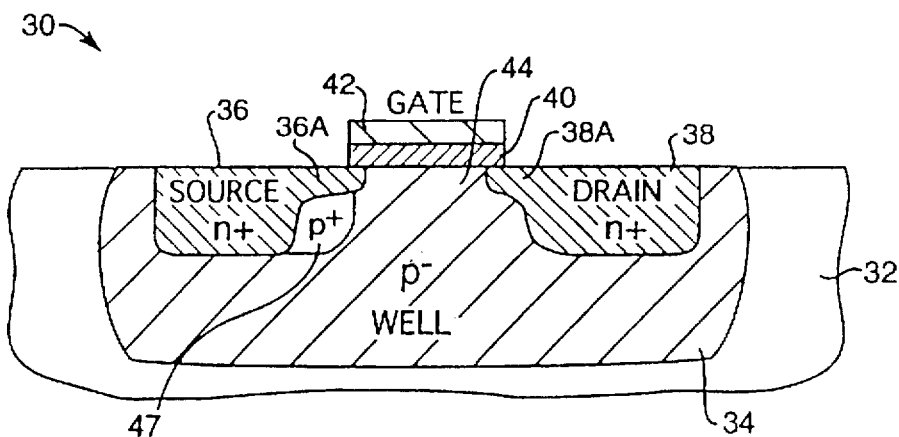
FIG. 1 is a side sectional view of an asymmetric MOS transistor having pocket region in accordance with the present invention.

FIG. 1 is a side sectional view of a first embodiment of an asymmetric MOSFET 30 of the present invention having a low threshold voltage and improved performance. The specific transistor 30 shown in FIG. 1 is an NFET, i.e., it has an n-type source, drain, and gate and a p-type well. Although not shown, transistor 30 could also be a PFET transistor having a p-type source, drain, and gate, and an n-type well.

In the following description of preferred embodiments, various dopant concentrations are specified. It should be understood that these concentrations are most appropriate for devices having drawn channel region lengths of about 0.35 μm (corresponding to effective channel lengths of about 0.25 μm) and gate oxide thicknesses of about 65 Å. It should also be understood that dopant concentrations in devices generally vary inversely with device size; as device size decreases, the dopant concentration increases. This is because (1) depletion regions adjacent source and drain regions must scale with channel region width to prevent punch through, and (2) to shrink the depletion regions, dopant concentrations must increase. As this invention is not limited to 0.35 µm technology, the concentrations set forth below are exemplary only. It should be expected that the recited concentrations will increase as necessary to reduce depletion region sizes in smaller devices (less than about 0.35 µm devices). Likewise, in larger channel devices, the recited concentrations may decrease.

Transistor 30 includes a lightly doped well region 34 extending downward from the surface of a semiconductor substrate 32 into its bulk. The bulk semiconductor may also be lightly doped, thus obviating the need for a separate well region. Preferably, the well region—excluding the source, drain, and pocket regions—has an average dopant concentration of between about $1\times10^{14}$ and $5\times10^{16}$ atoms/cm$^3$. A heavily doped n-type source region 36 with an associated "tip" 36A and a corresponding heavily doped drain region 38 with an associated tip 38A are provided in well region 34 as shown. The dopant concentrations of the source region 36 and drain region 38 are each preferably between about 1 and $2\times10^{20}$ atoms/cm$^3$. The dopant concentrations of the tips are between about 4 and $8\times10^{19}$ atoms/cm$^3$. In some embodiments, the source or drain will be shaped such that it does not have a tip; rather the plug portion of the source or drain will extend up to the channel region. Such devices will have lower source or drain resistances.

A channel region 44 having a relatively low dopant concentration of less than about $1\times10^{16}$ atoms/cm$^3$ (more preferably between about $1\times10^{14}$ and $1\times10^{16}$ atoms/cm$^3$, and most preferably about $1\times10^{15}$ atoms/cm$^3$) extends between the source and drain tip regions 36A and 38A. Such low channel region doping concentrations allow the device threshold voltage to be set at or near zero volts (either positive or negative). In preferred short channel devices of the present invention, the source and drain regions are positioned such that the inner boundaries of the tip regions are no more than about 2 µm apart, and are more preferably in the range of about 0.5 µm or less. As noted, the dopant concentrations presented herein are most appropriate for about 0.35 µm devices. It should be borne in mind that many advantages of the asymmetric structure of this invention also apply to longer channel devices.

A gate oxide layer 40 is provided on the surface of the p-type well 34 and overlying the channel region 44. In preferred embodiments (for 0.35 µm devices), gate oxide layer 40 is preferably about 65 Å thick. An n-type gate layer 42 is provided on the oxide layer 40 as shown. In general for the low threshold voltage devices of this invention, gate layer 42 will be n-type in NFETs and p-type in PFETs. In high threshold voltage PFETs, in contrast, the gate layer is typically made n-type.

Contacts (not shown) are provided for the source, drain, and gate regions respectively. In addition, a separate electrical contact (also not shown) may be provided for well region 34 so that the potential between the source and well regions can be controlled by an external circuit. This provides the capability of controlling the threshold voltage through back biasing as will be explained below. In devices having this capability, the well may be engineered to provide a relatively low-resistance path along its bottom side so that the well potential is nearly uniform. For example, a high concentration of dopant may be provided along the well bottom. Further, to ensure a good ohmic contact between the lightly doped well region and the well's electrical contact, it may be necessary to provide a heavily doped region (p-type for NFETs and n-type or PFETs) adjacent to the well contact. The various device contacts may be electrically isolated from one another and from gate 42 by an oxide, glass, or other insulating layer (sometimes referred to as a passivation layer).

An asymmetric halo or "pocket" region 47 is provided in well 34 underlying the source tip region 36A. It should be noted that the pocket region may be provided under either the source or drain region. However, throughout the remainder of this discussion, the asymmetric halo device will be described as having a pocket region under the source region. In preferred embodiments and as shown in FIG. 1, pocket region 47 does not extend into or under the channel region 44. However, in alternative embodiments discussed below, this need not be the case. In fact, the pocket region need not even reside "under" the source or drain. In some embodiments, it may simply abut the side of the source or drain region at a location near to the channel region. Regardless of its actual location and shape, the pocket region 47 has a "p+" concentration, i.e. it has a somewhat higher dopant concentration than the surrounding p-region of well 34. Preferably, the dopant concentration of pocket region 47 is between 10 and 1000 times greater than the dopant concentration in the well. Thus, the pocket region 47 should have a dopant concentration of at least about $1\times10^{16}$ atoms/cm$^3$, and more preferably between about $1\times10^{17}$ and $1\times10^{18}$ atoms/cm$^3$. These ranges apply for both NFETs and PFETs. In all embodiments of this invention, no corresponding pocket regions are provided under the drain tip 38A, hence the term "asymmetric." Of course, the present invention does not foreclose the possibility that some local increases in dopant concentration will be found around the drain region. However, to ensure that the device has the benefits of being asymmetric, any such local variations should be limited in size and/or dopant concentration.

It should be noted that the embodiment shown in FIG. 1, as well as all other embodiments discussed herein, could profitably be employed with a silicon on insulator ("SOI") structure—as distinguished from a conventional MOS structure—in which device elements are formed in a bulk silicon substrate. SOI structures include a base layer of bulk silicon on top of which is provided a layer of bulk silicon dioxide. Finally, on top of the silicon dioxide layer, a thin epitaxial layer of silicon—typically in the range of 70 to 2000 angstroms—is provided to form the device elements (source, drain, and channel region).

While not wishing to be bound by theory, it is believed that the following discussion explains the particular benefits that should generally be observed in low threshold voltage MOS devices having asymmetric halos. First, the pocket region provided under the source prevents punch through—a serious problem in short channel devices having low channel region dopant concentrations. This is accomplished by much the same mechanism as provided by buried electrodes, as discussed in U.S. patent application Ser. No. 08/292,513 (previously incorporated by reference). By providing a pocket region of higher dopant concentration below the tip of the source region, the growth of the depletion region adjacent to the source is limited. Further, the pocket implant arrests the growth of a depletion region extending from the drain toward the channel. The pocket region thus prevents the source and drain depletion regions from extending completely across the channel region.

More importantly, the asymmetric halo devices of this invention should provide significantly improved performance over other low Vt devices because, at appropriate gate voltages, their behavior is governed by charge carrier transport across a very short effective channel length (on the order of a few hundred angstroms to 0.1 micrometers). Specifically, the device is engineered so that the pocket region under the source creates a pseudo-device, or a "source FET" (within the larger MOS device) in this case, at the edge of the source and channel region. It is this pseudo-device that has the extremely short effective channel length. As explained below, in such very short channel devices, greatly improved performance can be expected due to an increased contribution from "ballistic" electron transport (i.e., transport without scattering). However, to obtain the improved performance, the asymmetric halo MOS device (which includes the source FET) should be operated such that its performance is dictated by the source FET (and hence these short channel effects), and not by longer channel effects (as it would be if the overall MOS structure dictated performance).

An explanation of how the short channel source FET is believed to be formed will now be provided. The pocket region next to the source introduces a local variation in the vertical field in a portion of the channel region near the source. This local change in the vertical field corresponds to a local increase in the threshold voltage. Thus, an asymmetric halo device acts as if it is actually two devices connected in series, a very short channel source FET having a relatively high threshold voltage and a long channel "drain FET" having a relatively lower threshold voltage. By operating such device at gate voltages just slightly greater than the threshold voltage of the source FET, the device performance can be expected to be governed by the performance of the short channel source FET. This possibility can not be realized in devices having buried electrodes or symmetric halo implants.

In operation, as the gate voltage is increased, it first surpasses the threshold voltage of the drain FET before reaching the threshold voltage of the source FET. In this gate voltage domain, intermediate between the threshold voltage of the drain FET and the threshold voltage of the source FET, an inversion layer forms extending from the drain-channel junction across the channel region to the edge of the source FET. Because no current is flowing, the inversion layer in the channel region acts as an extension of the drain, held at the same potential as the drain. In essence, the relatively large asymmetric halo device has been converted to an extremely small source FET device (in the gate voltage domain between the threshold voltages of the drain FET and the source FET). Now, when the gate voltage exceeds the threshold voltage of the source FET, an abrupt potential drop occurs across the source FET channel as current flows. From a performance standpoint, the asymmetric halo implant device appears quite promising because the short channel source FET pseudo-device allows some fraction of the electrons crossing the channel region to do so by very fast ballistic transport in which those electrons are not scattered by the silicon lattice. This, in turn, means that the source FET (and the entire device) should switch very fast under the right conditions.

In contrast, buried electrode devices will have lower performance because the region of increased dopant concentration (i.e., the buried electrode) extends the whole way across the channel region and provides no variations in vertical field. Thus, the effect of buried electrodes on threshold voltage is invariant across the channel length. Of course, if a buried electrode is employed in an asymmetric halo device, a short channel pseudo-device may still be created. Further, in symmetric halo devices, short channel pseudo-devices may also be formed. However, when such devices switch "on" the potential drop is spread over the length of the channel region (as opposed to over the length of the source FET in asymmetric halo devices). Thus, little contribution from ballistic transport can be expected.

In view of the above discussion, it should be apparent that asymmetric halo devices should be engineered such that the channel length of the source FET pseudo-device is made as small as possible (consistent with leakage constraints and avalanche breakdown mechanisms). The various factors that come into play in controlling the source FET channel length include (1) the dopant distribution in the tip of the source, (2) the dopant concentration gradient at the side of the pocket adjacent the channel region, (3) the dopant concentration gradient of the source body adjacent the pocket, and (4) the distance that the pocket extends into or underneath the channel region. By controlling these variables, it is believed that the source FET channel can be made smaller than 0.1 micrometers and preferably in the range of 200 to 500 angstroms. In general, good results should be expected by providing a very steep dopant concentration gradient at the boundary of the pocket and the bulk (well) regions. Preferably the dopant concentration will drop by as much as 3 orders of magnitude over about 3 nanometers between the pocket region and the bulk region. (Such steep gradients have been described in a paper by Sai-Halasz et al., "High Transconductance and Velocity Overshoot in NMOS Devices at the 0.1-µm Gate-Length Level," IEEE Electron Device Letters, Vol. 9, No. 9, pp. 463–465 (1988) which is incorporated herein by reference for all purposes.) Similarly, the dopant concentration gradients at the source tip-channel region boundary and at the source body-pocket boundary should be comparably steep. Still further, a thin tip region (with a pocket region lying immediately underneath) will generally improve performance by reducing punch through effects. Of course, if the tip region becomes too thin, the source resistance will be too high.

As noted, it is generally preferable to engineer the device so that the threshold voltage in the channel region (on the drain side of the source FET) is as low as possible.

For example, in NFETs, a channel region concentration of $10^{15}$ $cm^{-3}$ results, under the right conditions, in a −0.3V threshold. Even lower threshold voltages can be obtained by counter doping the channel region with n-type dopants (in NFETs). For certain devices, counterdopant concentrations in the range of about $10^{16}$ to $10^{18}$ $cm^{-3}$ result in a "drain FET" threshold voltage of about −0.5 volts. In general, the counterdopant profile is structured such that the depletion region emanating from the counterdopant-substrate interface does not extend through the n-type layer under the gate; otherwise the drain FET acts like a resistor and a substantial potential drop occurs across it. Thus, the counterdopant region should be thick enough, with a high enough concentration, to avoid becoming fully depleted. Assuming that the counterdopant region is engineered such that the depletion layer does not reach the surface, then a thin conducting layer is formed at the surface of the drain FET and the drain potential is effectively the same from the main part of the drain to the drain side of the source FET. This results in extremely high lateral fields across the source FET.

To allow for controlling of punchthrough in the source FET, the drain channel should not be too deep. In addition, its concentration should be lower than that of the source pocket region so that the net dopant concentration in the source pocket region results in the desired threshold voltage for the source FET, e.g. close to 0 volts. A properly engineered counterdopant region, in addition to reducing the threshold of the drain FET, causes the drain FET to become a buried channel device, improving mobility and subthreshold slope, reducing vertical field, and reducing gate capacitance.

Generally, low threshold devices (such as those of this invention) have relatively large leakage currents, a feature which, in the past, led engineers to design devices having relatively high threshold voltages. Thus, conventional devices are designed to have a ratio of "on current" to "off current" (a measure of leakage current) of at least about $10^6$ and typically in the range of $10^7$ to $10^8$. Such high ratios may be appropriate for relatively inactive circuits such as RAM cells. However, in more active circuits typically used in microprocessors, the leakage current may be of less concern, and the threshold voltage can be substantially lowered. The present invention is primarily concerned with such low threshold voltage devices. Therefore, the devices of the present invention will preferably be characterized by a ratio of on current to off current of at most about $10^5$, and more typically about $10^2$–$10^3$. For some highly active devices, it may even be desirable to have a ratio of on current to off current of as low as 10. In terms of absolute threshold voltage, the MOS devices of this invention will preferably have a Vt of between about −150 and +150 millivolts. However, this range is not critical to the practice of the invention.

Figure 2:
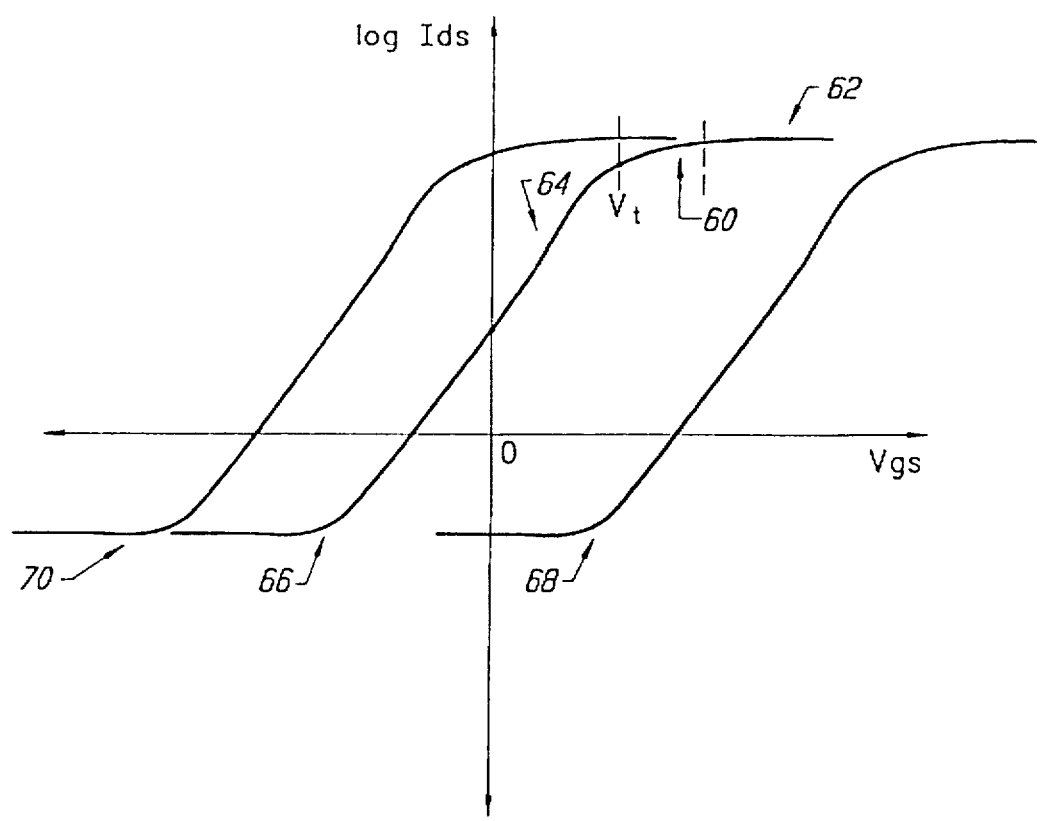
FIG. 2 is a graph showing a typical family of device current ($I_{ds}$) versus gate voltage ($V_{gs}$) curves for transistors having differing channel region dopant concentrations.

FIG. 2 shows a family of log $I_{ds}$ (logarithm of channel current) versus $V_{gs}$ (gate voltage) curves for different devices operated at constant Vds. Each curve is provided for a different channel region dopant concentration, with curves having subthreshold regions at lower (more negative) gate voltages describing devices having lower channel region dopant concentrations in accordance with the present invention. Referring to curve 66—which describes a device in accordance with this invention—a threshold voltage (Vt) is provided where subthreshold region 64 and transition region 60 meet. A strong inversion region 62 exists beyond transition region 60 and is characterized by a linear current profile with increasing $V_{gs}$. With all other device variables being equal, curves 70 and 68 describe devices having lower and higher channel region dopant concentrations, respectively, than the device described by curve 66. The subthreshold Vg versus I slope is generally given by the equation, Ms=n $V_T$ ln(10), where Ms is the subthreshold slope, n is ideally 1, and $V_T$ is the thermal voltage, defined by kT/q. Thus, the subthreshold slope becomes steeper with decreasing temperature.

By providing light doping in the channel region of a device, the device's threshold voltage will be at or near zero, in the region preferred for this invention. Due to processing variations, the exact dopant concentration in the channel region can vary slightly from device to device. Although these variations may be slight, they can shift a device's threshold voltage by a few tens or even hundreds of millivolts (to outside of the preferred range for operation of this invention). Further, environmental factors such as operating temperature fluctuations can shift the threshold voltage. Thus, it is desirable to provide a mechanism for tuning the threshold voltage in low threshold voltage devices such as those of this invention. As noted above this can be accomplished by using back biasing, i.e. controlling the potential between a devices well and source. See James B. Burr, "Stanford Ultra Low Power CMOS," Symposium Record, Hot Chips V, pp. 7.4.1–7.4.12, Stanford, Calif. 1993 which is incorporated herein by reference for all purposes.

Back biasing is accomplished by controlling the potential difference between the source and well regions of the transistor. Typically, the potential will be controlled through isolated ohmic contacts to the source and the well regions together with the circuitry necessary for independently controlling the potential of these two regions. As the potential difference is increased, the magnitude of the threshold voltage increases. In general, a relatively large back bias voltage is required to adjust the threshold voltage a comparatively small amount. In preferred embodiments, the device will be engineered such that a shift in threshold voltage of about 100 millivolts is accomplished with about 1 volt of back bias.

Back biasing can be implemented using various automatic techniques. In one such method, a feedback amplifier adjusts the bias voltage of a well so that the drain current of a test device in the well matches a reference current. A tuning circuit can be designed to match the off current (in the range of 1 nanoamp to 1 microamp), or the on current (in the range of 100 microamp/micrometer), or some function of both the on and off currents. Such circuits can sample the current from several test devices to obtain average on and off currents. The power dissipation of one of these well-tuning circuits is typically quite small, on the order of 1 microwatt, and its area is also small, typically about 100 square micrometers, so that hundreds or even thousands of such circuits can be distributed throughout an integrated circuit chip without significantly impacting area or power, while substantially improving low voltage performance by providing tightly controlled operating environments over small, local transistor populations.

Figure 3:
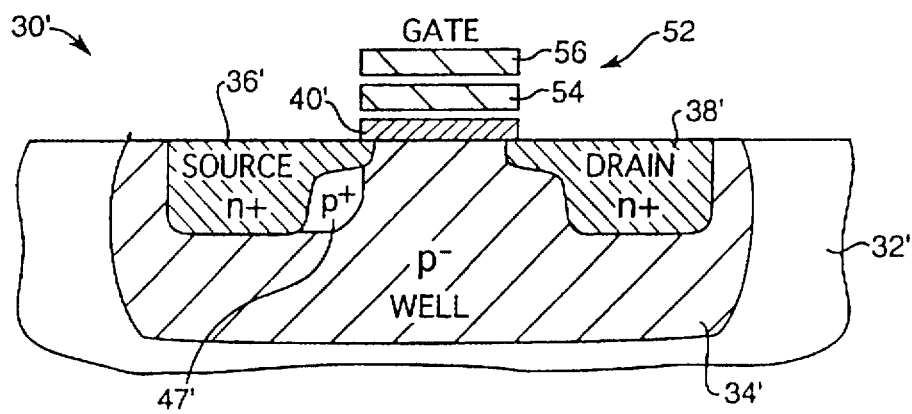
FIG. 3 is a side sectional view of an asymmetric MOS transistor as shown in FIG. 1 but also having a floating gate structure in accordance with this invention.

FIG. 3 shows an alternative embodiment of a MOSFET transistor 30' having a low threshold voltage that is tunable by a floating gate. Like the embodiment shown in FIG. 1, the transistor 30' of FIG. 3 includes well region 34', source region 36', and drain region 38'. Transistor 30' also includes an asymmetric halo or pocket region 47' having a relatively high concentration of dopant under the tip of source region 36'. MOSFET 30' includes two gate layers in a floating gate structure 52. First gate layer 54 is deposited on oxide layer 40', and second gate layer 56 is deposited above first gate layer 54 on an insulating layer. As is known in the art, a fixed voltage (and associated charge) may be applied to first gate 54 to control the threshold voltage of gate 56. Thus, by using the floating gate structure 52, the threshold voltage of the transistor 30' can be electrically controlled in much the same manner as by using back biasing.

FIGS. 4A–J illustrate some of the important steps in the fabrication of an MOS device (an NFET in this example) in accordance with the present invention. It should be understood that numerous variations of this process are permissible and within the scope of this invention. Further, although this process is described as a sequence of steps for forming an NFET, the process could be applied equally to a PFET if the conductivity types of the dopants employed in the various steps are reversed. Still further, it should be understood that the conditions recited herein are appropriate for devices in the neighborhood of 0.35 μm. The process conditions may have to be modified somewhat for devices in other size regimes, as is known in the art.

Figure 4A:
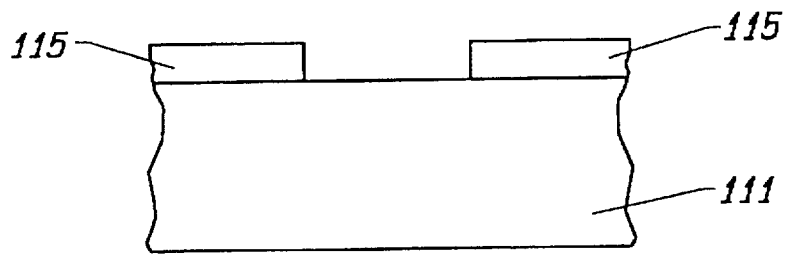
FIGS. 4A–4J are side sectional views of a partially completed transistor in accordance with this invention at various stages of fabrication.

In FIG. 4A, a substrate 111 of silicon or other suitable semiconductor material is provided with an ion implant mask 115 of photoresist or other suitable masking material which exposes a selected portion (the "p-well portion") of substrate 111.

Figure 4B:
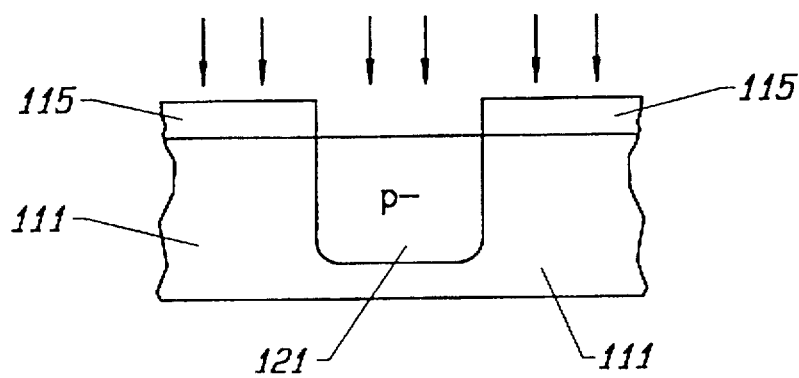

In FIG. 4B, a p-type ion implant is performed over the substrate, penetrating the unmasked portion of the substrate 111 (the "p-well portion"). The p-type dopant is provided at a dose and energy sufficient to provide a very lightly doped well region 121. A subsequent diffusion anneal is conducted at a temperature and for a time sufficient to smooth out the p-type dopant concentration over well region 121 to give a relatively uniform overall very light p-doping level. The well formation conditions should be chosen such that the p-well region has a dopant concentration at the substrate surface (i.e., the channel region) of between about $1\times10^{14}$ and $1\times10^{16}$ atoms/cm$^3$ (as discussed above). It should be noted that, in many systems, there is no explicit p-well. Rather, the silicon wafers used to make the devices are grown with a specific dopant concentration. In an epitaxial process, a layer of silicon of the desired bulk concentration is provided on top of a heavily doped substrate.

Figure 4C:
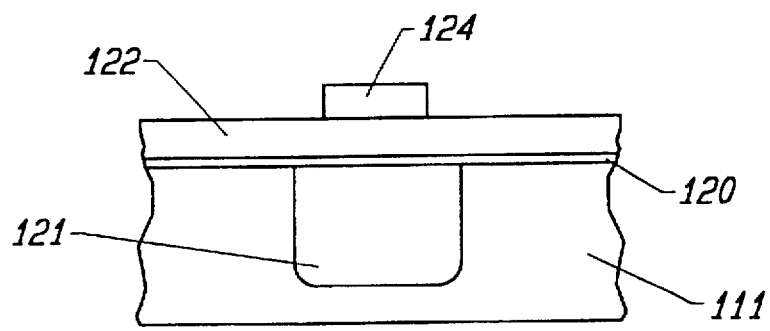

To obtain the structure shown in FIG. 4C, the mask 115 is removed and a pad oxide 120 (silicon dioxide) covering the substrate 111 is grown to a thickness of between about 30 and 80 nanometers at a temperature in the range of about 700° to 1000° C. Next, a layer of silicon nitride 122 is deposited, typically by low pressure vapor chemical deposition (LPCVD), to a thickness of between about 0.1 and 0.2 micrometers on pad oxide 120.

Thereafter, a resist mask 124 is provided to protect the active areas (i.e., regions where active transistors are to be formed).

Figure 4D:
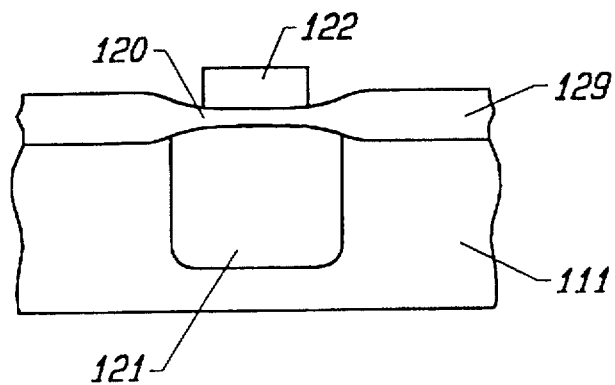
Figure 4E:
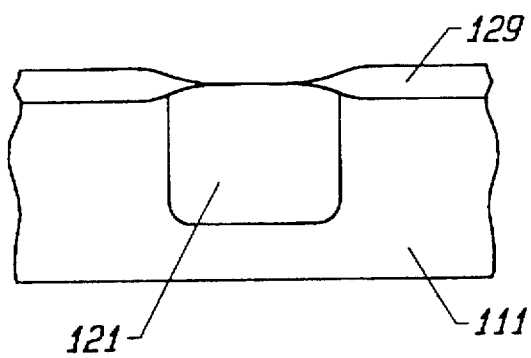
Figure 4F:
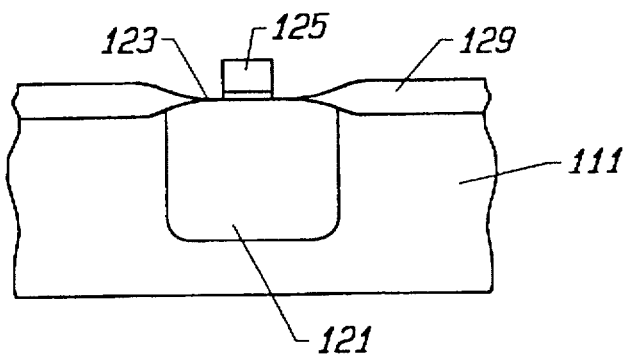

The structure shown in FIG. 4D is then prepared as follows. A dry etch (typically a reactive ion etch or RIE) is performed on the exposed nitride and oxide layers to produce a bare silicon surface in these regions. Next, the resist mask is removed and a thick field oxide 129 (silicon dioxide) is grown at a temperature of between about 700° and 1000° C. to a thickness of between about 0.2 and 0.5 micrometers to produce the structure shown in FIG. 4D. Thereafter, this structure is selectively etched to remove nitride layer 122, typically by a wet etch with ortho-phosphoric acid. A timed wet etch is then performed to remove the pad oxide 120 and expose the silicon substrate in the active device regions. This produces a structure as shown in FIG. 4E. The field oxide 129 is used to electrically isolate the various devices on a chip. In alternative embodiments, trenches could be used in place of the field oxide to isolate devices on the chip. Processes for forming trench isolation regions are known in the art.

After the bare silicon substrate has been exposed, a thin gate oxide 123 is grown on the silicon surface at a temperature of between about 800° and 950° C. to a thickness of between about 3 and 15 nanometers. Typically, the gate oxide will be a single layer of silicon dioxide, but it may also be a multilayer structure including silicon nitride. (Technically, such multilayer structures should be referred to as "gate dielectrics" rather than merely "gate oxides.") After the gate oxide or gate dielectric has been formed, a gate layer of polysilicon is deposited over the surface to a thickness of between about 100 and 300 nanometers. On this layer, a resist mask is defined to protect the transistor gate region. Then, the exposed polysilicon is selectively etched and the resist mask is removed to provide the structure shown FIG. 4F.

Figure 4G:
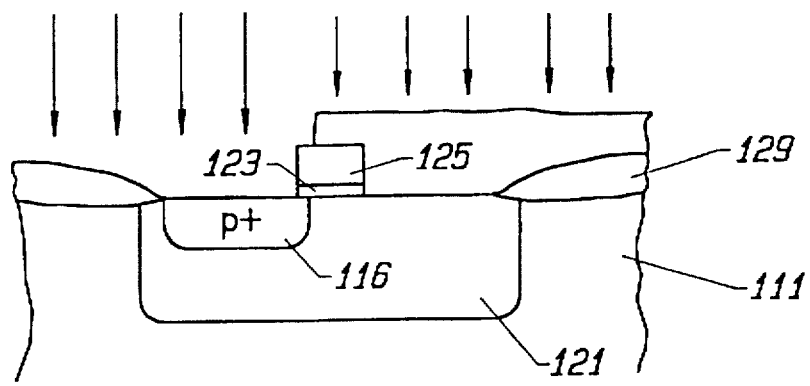

Next, as shown in FIG. 4G, a mask 126 is formed over one side of the active region. Thereafter a p-type dopant implant is conducted at an energy and dosage sufficient to form an asymmetric pocket region 116. For example, the asymmetric halo implant might be conducted with boron implanted at about $5\times10^{12}$ to $5\times10^{13}$ cm$^{-2}$ at an energy of between about 50 and 70 keV. In some embodiments, indium may be an appropriate dopant for NFETs and antimony may be an appropriate dopant for PFETs because these elements have relatively small diffusion coefficients and therefore are likely to form pockets having steeper concentration profiles.

Figure 4H:
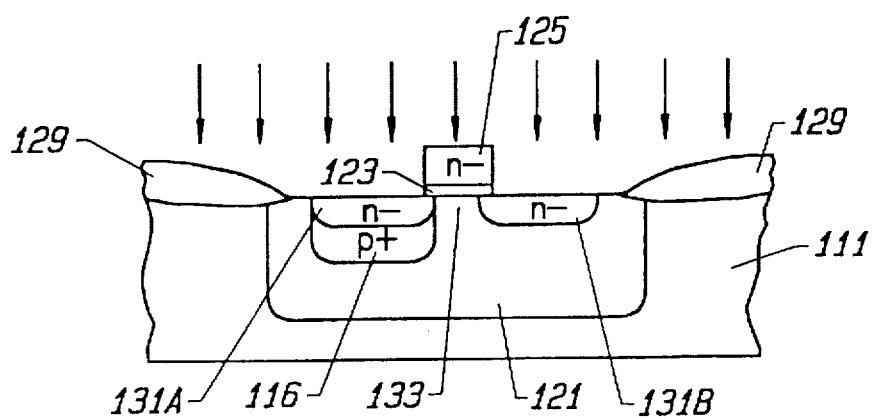

Next as shown in FIG. 4H, the mask 126 is removed and an n-type ion implant is conducted at an ion dose of about $10^{13}$–$10^{14}$ cm$^{-2}$ and an ion kinetic energy of between about 20 and 60 keV with ions drawn from P, As, Sb, or Sn. This implant is performed over the entire substrate, penetrating the p-well portion of the apparatus to form two n doped layers 131A and 131B flanking a p-type channel region 133 to the left and right, respectively, within the p-well 121. This implant is intended to form a device's source and drain "tip" regions which extend to the edge of the channel region. As shown, an asymmetric halo region 116 remains below the source tip region 131A. In preferred embodiments, the junctions between these tip regions and the adjacent channel region have steep dopant concentration gradients. Thus, subsequent processing should be conducted under conditions which minimize dopant diffusion in these tip regions. To the extent possible, this will generally require conducting subsequent heating steps at relatively low temperatures and for relatively short times, or by using rapid thermal annealing ("RTA") as known in the art.

Figure 4I:
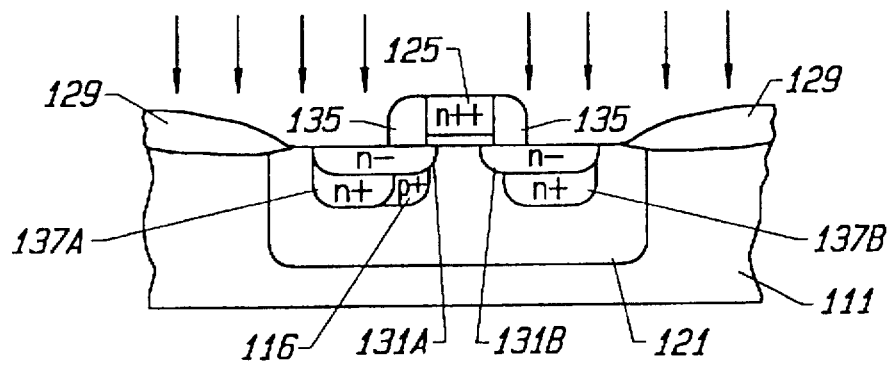

After the tip regions have been formed, "plug" regions 137A and 137B of the source and drain shown in FIG. 4I are optionally formed as follows. To prepare such plug regions, a blanket oxide insulating layer is first deposited over the device. Most of this layer is then anisotropically etched away, leaving side wall insulating spacers 135 of width 0.1–0.3 µm, flanking the polysilicon gate 125 on the right and left as shown in FIG. 4I. Thereafter, an n+ion implant (ion dose=$1\times10^{15}$–$5\times10^{15}$ cm$^{-2}$; ion kinetic energy=50–100 keV; ions drawn from P, As, Sb, or Sn) is performed over the substrate, penetrating the p-well portion of the structure. This produces drain and source layers 137A and 137B of increased n-type doping. As can be seen in FIG. 4I, after the plug regions of the source and drain are formed, an asymmetric halo region 116 remains under source tip 131A and adjacent to the channel region. After drain and source layers 137A and 137B have been formed, an anneal step is performed. In preferred embodiments, only this anneal step (and no others) are conducted for the asymmetric halo, tip, and plug implants. In other words, no anneal step is performed after the asymmetric halo or tip implants. This limited annealing allows the halo and tip regions to maintain relatively steep concentration gradients near the channel region.

Figure 4J:
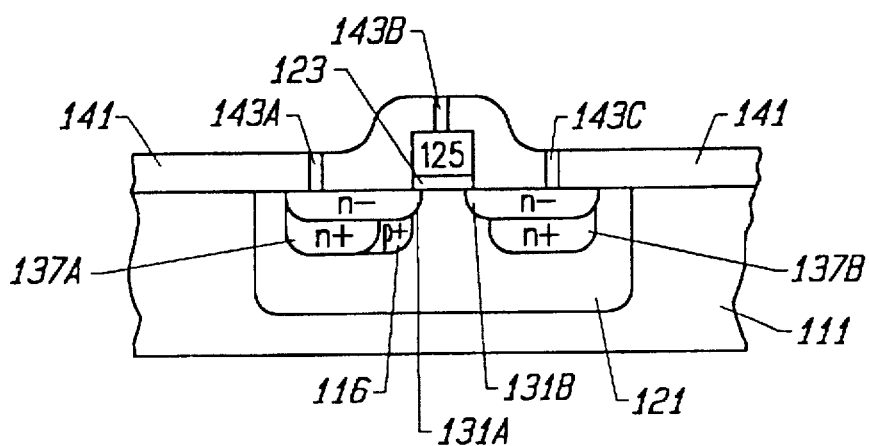

After the source and drain regions have been formed, an insulating layer 141 is formed over the device as shown in FIG. 4J. Apertures or vias 143A, 143B, and 143C are then selectively etched in the oxide layer 141 and filled with metal, such as aluminum, tungsten, titanium or other electrically conductive material to provide electrical contacts for the drain 131A, gate 125, and source 131B. In devices having back biasing capabilities, a fourth electrical contact to the well will also be required to permit control of the potential between the source and well. To provide an ohmic contact to the lightly doped well, a small p+ implant in the region of the contact (in the well) may also be necessary.

It should be noted that the process depicted in FIGS. 4A–4J includes no channel region implants of the type which produce devices having high dopant concentrations in the channel region and consequently high threshold voltages. In fact, the total dopant concentration in the channel region is preferably maintained at a level no more than about $1\times10^{16}$ atoms/cm$^3$, and more preferably between about $1\times10^{14}$ and $1\times10^{16}$ atoms/cm$^3$. Most preferably, the channel region dopant concentration is about $1\times10^{15}$ atoms/cm$^3$.

which is substantially lower than the concentration of 1 to $5\times10^{17}$ atoms/cm$^3$ for conventional 0.35 µm high threshold voltage devices. Of course, the threshold voltage can be kept near zero even in devices having higher dopant concentrations so long as the "net" concentration of dopant atoms of a particular conductivity type is maintained at a low level. This condition can be attained by, for example, conducting two (or more) channel region implants of opposite conductivity type, so that the effects of the two implants offset one another somewhat. Of course, it will generally be preferable to fabricate low threshold voltage devices without conducting such offsetting implants in the channel region, as each implant adds new scattering impurities to the semiconductor lattice.

In processes for fabricating standard, high threshold voltage surface (buried) channel devices, a surface implant of the same (opposite) dopant of conductivity type as that of the channel region of the well is performed to adjust the threshold voltage of the device to a standard level. This surface implant is typically conducted under conditions which give the device a threshold voltage of about 0.7 volts or −0.7 volts (depending on the conductivity type of the transistor). To achieve a low threshold voltage (consistent with this invention), the step of conducting the surface implant is omitted. In addition, for PFETs prepared in accordance with this invention, the gate is preferably doped p-type.

In an alternative embodiment, the order the "tip" and "plug" implants employed to make the source and drain regions may be reversed. In this process, the side wall spacers 135 are formed before any source/drain implants. Then, the source/drain plug implant is performed under the conditions described above. After this, the spacers are removed and a mask is formed over the drain region and the asymmetric halo implant is performed under the conditions described above. Next, the mask is removed from the drain region and "tip" implants are performed to produce source, drain, and asymmetric halo regions having the profiles illustrated in FIG. 4I. The advantage of this approach is that it produces the tip regions later in the process, thereby better preserving the steep dopant concentration gradients at the tip-channel region junctions. However, because of the added complexity, this process may provide the most benefit at technologies below 0.1 µm.

Figure 7A:
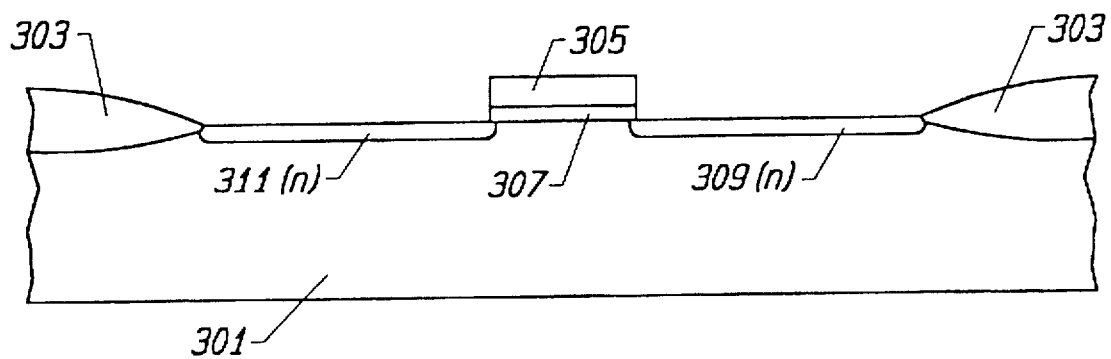
FIGS. 7A–7E are side sectional views of a partially completed transistor prepared in accordance with a preferred process of this invention.
Figure 7B:
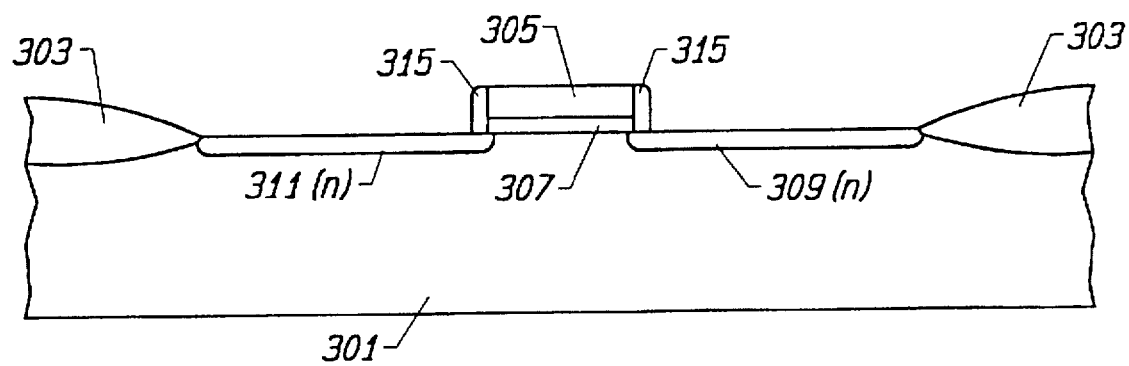
Figure 7C:
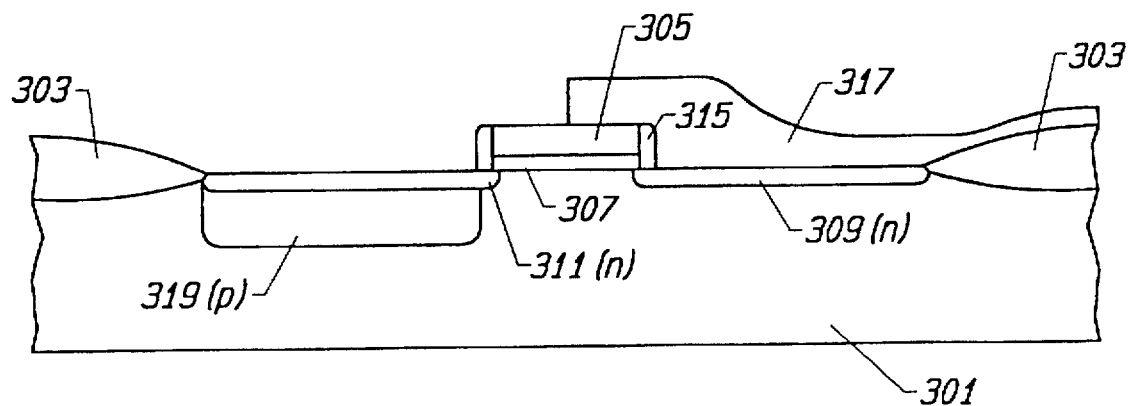

Another alternative process for forming the source/drain and pocket regions is shown in FIGS. 7A–7E. In this embodiment, as shown in FIG. 7A, n-type tip regions 311 and 309 are formed in a bulk region 301 between field oxide regions 303 and a gate oxide 307 (under a gate poly 305). Regions 311 and 309 may be formed under conditions comparable to those employed to form regions 131A and 131B in FIG. 4H. Next, as shown in FIG. 7B, a first spacer 315 is formed along the sides of gate oxide 307 and gate poly 305. Thereafter a mask 317 is formed over the drain side of the device, and a p-type implant is conducted to produce an asymmetric implant region 319 (to be converted to a pocket region) to produce the structure shown in FIG. 7C. The p-type implant may be performed under conditions comparable to those employed to form region 116 in FIG. 4G.

Figure 7D:
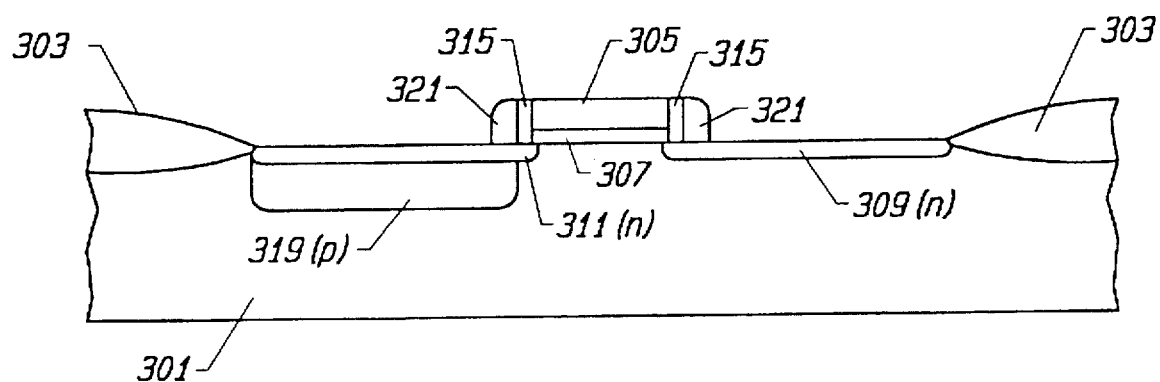
Figure 7E:
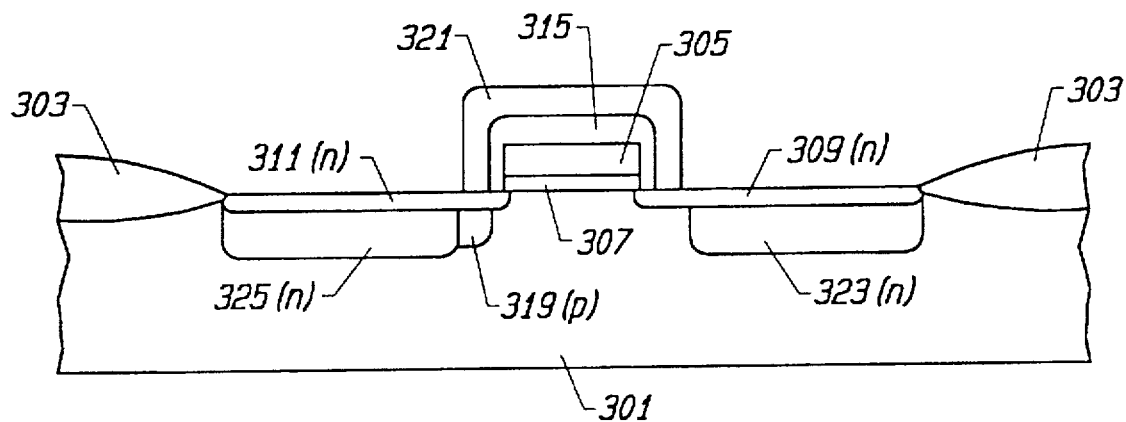

At this point, the mask 317 is removed and a second spacer 321 is formed on the sides of gate region beyond the first spacer 315 to provide the structure shown in FIG. 7D. Thereafter an n-type implant is performed to form source and drain plug regions 325 and 323, leaving p-type pocket region 319 only in the vicinity of the channel region as shown in FIG. 7E. This implant may be conducted under conditions comparable to those employed to form regions 137A and 137B in FIG. 4I.

In still another embodiment, source and drain regions include—in additional to the tip regions—structures rising above the silicon substrate surface. Such structures will typically be silicides having relatively low resistance and will not include the plug regions 137A and 137B. Thus, the overall resistance of the source and drain regions is maintained at a relatively low level without requiring plug regions.

In embodiments employing a buried electrode, an epitaxial layer may be employed. One of the objectives of the buried electrode is to achieve a low dopant concentration in the channel region and higher dopant concentration at the top edge of the pocket region. Ideally, this would be a step junction. However, limitations in ion implantations and thermal anneal cycles (late in the fabrication process) tend to smear out step junctions. This problem can be partially mitigated by selecting a dopant species which is relatively immobile (i.e., it has a relatively low diffusion coefficient). Another approach is to grow a lightly doped silicon epitaxial layer on top of a heavily doped bulk substrate. The epitaxial depletion region can have a very abrupt junction and thereby come much closer to the ideal step profile than can be produced by ion implantation.

Figure 5:
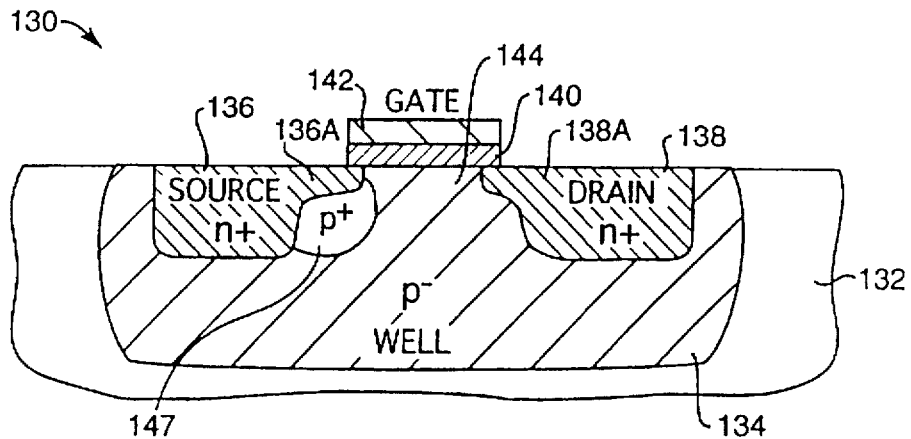
FIG. 5 is a side sectional view of an asymmetric MOS transistor having a pocket region extending under the device's channel region in accordance with an alternative embodiment of the present invention.
Figure 6:
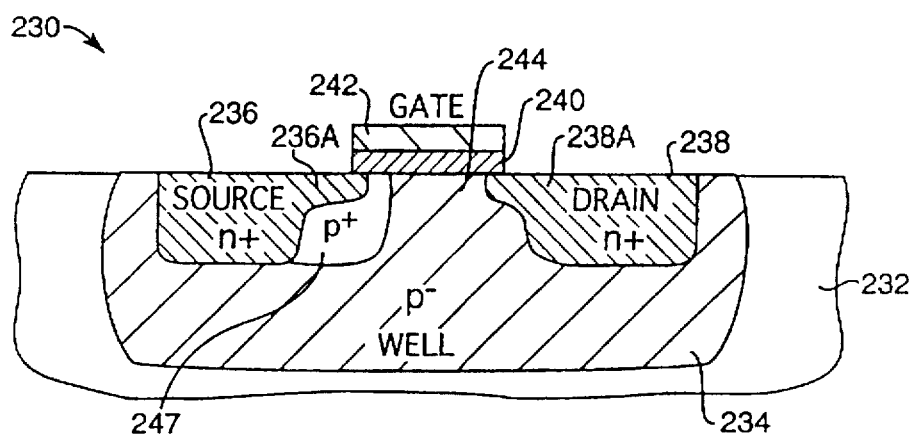
FIG. 6 is a side sectional view of an asymmetric MOS transistor having a pocket region extending into the device's channel region in accordance with another alternative embodiment of the present invention.

FIGS. 5 and 6 display alternative embodiments of the present invention in which the pocket region underlining the source tip takes on different shapes. In FIG. 5, an asymmetric CMOS device 130 includes a pocket region 147 which extends slightly under channel region 144 (compare pocket region 47 of FIG. 1). Otherwise, this embodiment is quite similar to that depicted in FIG. 1. Specifically, the device includes a source 136, a drain 138, a well 134, a gate 142, and a gate dielectric 140. As device 130 is also an asymmetric halo device, there is no pocket region under drain 138. The pocket region 147 can be formed by, for example, an implant made at an angle having a horizontal component (left to right as shown in FIG. 5). Generally, such angled implants are relatively easy to perform.

In FIG. 6, an asymmetric MOS device 230 includes a pocket region 247 that not only extends beyond the edge of source region 236 but actually into channel region 244. In some devices without tip regions in the source or drain, the pocket region may simply abut the channel side of the source or drain regions without extending under the source or drain regions. In one embodiment, the channel region 244 is counterdoped with n-type dopants (e.g., $1\times10^{17}$ cm$^{-3}$) to lower the device Vt and produce a true short-channel NFET. It is important that pocket region 247 not extend too far across channel region 244 in order to preserve a local variation in vertical field and constrain the effect of the pocket to a relatively small area near the source. It can be expected that this structure may result in an increased lateral field at the edge of the source and consequently a shorter effective source FET channel length. Thus, the contribution from ballistic electrons can be expected to be more pronounced in such devices. On the downside, the increased dopant concentration adjacent the source will decrease the mobility of non-ballistic electrons.

In other alternative embodiments, the pocket of an asymmetric halo device could extend from the edge of the channel region under the source to near the far edge of the source. In still other embodiments, the asymmetric halo device could have, in addition to any of the above described pocket regions, a buried electrode extending under the entire channel region. This would allow better tunability of the device threshold voltage.

It is known that CMOS devices operate differently at different temperatures. As a device is cooled, the charge carrier mobility in the channel region increases. The threshold voltage also increases. Most importantly, the performance of the transistor increases for a given threshold voltage due to the increased mobility of charge carriers and the reduced critical voltage of the device. This is generally true of long channel and short channel devices. Thus, at lower temperatures, most conventional devices can be expected to have improved performance.

However, even greater performance improvements can be expected with the asymmetric halo devices of this invention. This is because the contribution of ballistic electrons to device current rapidly increases with decreasing temperature in the extremely short effective channel lengths of the source FET pseudo-devices. As the temperature is lowered, the effect of phonons on electron transport becomes less pronounced and the mean free path of an electron in silicon increases to near the channel length of the source FET. Of course, some percentage of traveling electrons jump by a distance greater than the mean free path, and even jump across the channel length. Such electrons move ballistically from source to drain. At temperatures in the range of liquid nitrogen temperature, a significant percentage of the electrons crossing the source FET channel will do so ballistically (assuming that the source FET effective channel length is sufficiently short).

To take advantage of such performance improvements at lower temperatures, the doping levels of devices may have to be modified. For example, for devices having a threshold voltage of zero millivolts at the temperature of liquid nitrogen temperature (77K.), the doping levels should be set so that the threshold voltage would be about −200 mV at 300K. This is because a device's current versus gate voltage curves shift with temperature. Of course, it may be possible to provide the device with sufficient tunability to operate over the entire temperature range. However, this extra tunability may compromise performance in some devices. When this is the case, devices will need to be optimized over a relatively narrow specified temperature range.

To implement low temperature CMOS transistors of the present invention, a cooling environment must be provided. Preferred cooling systems operate at 0° C., −55° C., and −150° C., with performance improving but cost increasing with each lower temperature. At each of the listed temperatures, adequate cooling can be provided by a small refrigerator. Below −150° C., refrigeration costs become significantly higher, and carrier freeze out effects may create instabilities that are difficult to control.

It should be noted that in many short channel MOSFET devices, a large horizontal electric field associated with a relatively high Vdd can cause hot electron degradation, in which electrons penetrate the oxide layer above the bulk region or the drain region. This problem is typically solved using lightly doped drain (LDD) implants which provide a relatively low concentration of dopants in the tip regions 36A and 38A of source and drain regions 36 and 38. In the present invention, however, LDD's are typically not necessary, since the problem of hot electrons becomes negligible at supply voltages below about 1.5 volts.

Although certain preferred embodiments of the present invention have been described, it should be understood that the present invention may be embodied in many other specific forms without departing from the spirit or scope of the invention. Particularly, the NFETs illustrated above can be replaced with PFETs and the asymmetric halo structure may find some usefulness in long channel devices. Therefore, the present examples are to be considered as illustrative and not restrictive, and the invention is not to be limited to the details given herein, but may be modified within the scope of the appended claims.

What is claimed is:

1. An asymmetric MOS device on a semiconductor substrate, the MOS device comprising:
   a bulk region having an average dopant concentration of a first conductivity type;
   source and drain regions positioned within said bulk region and separated by a channel region, the source and drain regions having a dopant concentration of a second conductivity type;
   an asymmetric halo region having a dopant concentration of the first conductivity type, and abutting one of said source and drain regions and proximate said channel region effectively creating two pseudo-metal oxide semiconductor devices connected in series, a first pseudo device disposed away from the asymmetric halo region and having a first threshold voltage and a second pseudo device located proximate the asymmetric halo region and having a second threshold voltage which is higher in magnitude than the first threshold voltage, wherein the second pseudo device has a second effective channel length that is shorter than a first effective channel length of the first pseudo device and a substantial number of carriers can be transported across the channel of said second pseudo device ballistically; and
   a single gate electrode positioned over the channel region, wherein the wherein the device has a gate threshold voltage of at most about ±150 mV.

2. The asymmetric MOS device of claim 1 wherein a dopant concentration in the channel region is at most about $1 \times 10^{16}$ atoms/cm$^3$.

3. The asymmetric MOS device of claim 2 wherein a dopant concentration in the channel region is between about $1 \times 10^{14}$ and $1 \times 10^{16}$ atoms/cm$^3$.

4. The asymmetric MOS device of claim 1 wherein the device has a tunable gate threshold voltage.

5. The asymmetric MOS device of claim 4 wherein the gate threshold voltage is tunable by back biasing.

6. The asymmetric MOS device of claim 1 wherein the dopant concentration in the asymmetric halo region is at least about $1 \times 10^{16}$ atoms/cm$^3$.

7. The asymmetric MOS device of claim 6 wherein the dopant concentration in the asymmetric halo region is between about $1 \times 10^{17}$ and $1 \times 10^{18}$ atoms/cm$^3$.

8. The asymmetric MOS device of claim 1 wherein said asymmetric halo region is located under at least part of one of said source and drain regions, and said asymmetric halo region does not extend into or under said channel region.

9. The asymmetric MOS device of claim 1 wherein said asymmetric halo region is located under at least part of one of said source and drain regions, and said asymmetric halo region extends under a part of said channel region adjacent said source and drain region.

10. The asymmetric MOS device of claim 1 wherein said asymmetric halo region is located under at least part of one of said source and drain regions, and said asymmetric halo region extends partially into said channel region.

11. The asymmetric MOS device of claim 1 wherein said channel region has a length of about 2 microns or less.

12. The asymmetric MOS device of claim 1 wherein at least a portion of said channel region includes counterdopant of the second conductivity type.

13. The asymmetric MOS device of claim 12 wherein the counterdopant is provided in a concentration of between about $10^{16}$ and $10^{18}$ cm$^{-3}$.

14. The asymmetric MOS device of claim 13 wherein the counterdopant is provided in a concentration and location such that a depletion region associated with a counterdopant-bulk junction does not extend across the channel region to the gate.

15. The asymmetric MOS device of claim 1, wherein the MOS device has a ratio of on current to off current that is not greater than about $10^5$.

16. An asymmetric MOS device on a semiconductor substrate, the MOS device having an on current and an off current, the MOS device comprising:

a bulk region having an average dopant concentration of a first conductivity type;

source and drain regions positioned within said bulk region and separated by a channel region, the source and drain regions having a dopant concentration of a second conductivity type;

an asymmetric halo region having a dopant concentration of the first conductivity type, and abutting one of said source and drain regions and proximate said channel region; and a single gate electrode positioned over the channel region, wherein the device has a gate threshold voltage of at most about +150 mV at room temperature.

17. The asymmetric MOS device of claim 16 wherein a dopant concentration in the channel region is at most about $1 \times 10^{16}$ atoms/cm$^3$.

18. The asymmetric MOS device of claim 17 wherein a dopant concentration in the channel region is between about $1 \times 10^{14}$ and $1 \times 10^{16}$ atoms/cm$^3$.

19. The asymmetric MOS device of claim 16 wherein the device has a tunable gate threshold voltage.

20. The asymmetric MOS device of claim 19 wherein the gate threshold voltage is tunable by back biasing.

21. The asymmetric MOS device of claim 16 wherein the dopant concentration in the asymmetric halo region is at least about $1 \times 10^{16}$ atoms/cm$^3$.

22. The asymmetric MOS device of claim 21 wherein the dopant concentration in the asymmetric halo region is between about $1 \times 10^{17}$ and $1 \times 10^{18}$ atoms/cm$^3$.

23. The asymmetric MOS device of claim 16 wherein said asymmetric halo region is located under at least part of one of said source and drain regions, and said asymmetric halo region does not extend into or under said channel region.

24. The asymmetric MOS device of claim 16 wherein said asymmetric halo region is located under at least part of one of said source and drain regions, and said asymmetric halo region extends under a part of said channel region adjacent said source and drain region.

25. The asymmetric MOS device of claim 16 wherein said asymmetric halo region is located under at least part of one of said source and drain regions, and said asymmetric halo region extends partially into said channel region.

26. The asymmetric MOS device of claim 16 wherein said channel region has a length of about 2 microns or less.

27. The asymmetric MOS device of claim 16 wherein at least a portion of said channel region includes counterdopant of the second conductivity type.

28. The asymmetric MOS device of claim 2 wherein the counterdopant is provided in a concentration of between about $10^{16}$ and $10^{18}$ cm$^{-3}$.

* * * * *

UNITED STATES PATENT AND TRADEMARK OFFICE
CERTIFICATE OF CORRECTION

PATENT NO. : 5,780,912

DATED : July 14, 1998

INVENTOR(S) : Burr *et al.*

It is certified that error appears in the above-identified patent and that said Letters Patent is hereby corrected as shown below:

IN THE CLAIMS:

Claim 2, line 31, please replace the word "a" with the word --the--.

Claim 18, line 29, please replace the word "a" with the word --the--.

Signed and Sealed this

Twenty-ninth Day of December, 1998

Attest:

BRUCE LEHMAN

*Attesting Officer*  *Commissioner of Patents and Trademarks*